(12) United States Patent
Nishizawa et al.

(10) Patent No.: US 8,878,541 B2
(45) Date of Patent: Nov. 4, 2014

(54) BATTERY VOLTAGE MONITORING CIRCUIT

(75) Inventors: Akihiro Nishizawa, Tokyo (JP);
Takashi Takeda, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 238 days.

(21) Appl. No.: 13/278,325

(22) Filed: Oct. 21, 2011

(65) Prior Publication Data

US 2012/0112755 A1 May 10, 2012

(30) Foreign Application Priority Data

Nov. 5, 2010 (JP) ................................ 2010-248213

(51) Int. Cl.
*G01N 27/416* (2006.01)
*H01M 10/42* (2006.01)
*G01R 31/36* (2006.01)

(52) U.S. Cl.
CPC ........... *H01M 10/425* (2013.01); *G01R 31/362* (2013.01); *G01R 31/3658* (2013.01)
USPC ........... 324/433; 324/426; 324/427; 324/434; 320/116; 320/117; 320/118; 320/119; 320/120; 320/121; 320/122; 320/123; 320/152; 320/157; 320/158; 320/159; 320/162; 320/163; 320/164; 420/93

(58) Field of Classification Search
USPC .......... 324/426, 433, 434, 427; 320/116–123, 320/152, 157–159, 162–164; 429/93
See application file for complete search history.

(56) References Cited

U.S. PATENT DOCUMENTS

2007/0188146 A1* 8/2007 Nakano et al. ................ 320/132
2008/0036424 A1* 2/2008 Saigo ............................ 320/136
2008/0079434 A1 4/2008 Oosawa et al.
2009/0198399 A1* 8/2009 Kubo et al. ...................... 701/22
2009/0295396 A1 12/2009 Kouchi et al.
2010/0052656 A1* 3/2010 Tanaka et al. ............. 324/123 R

FOREIGN PATENT DOCUMENTS

| JP | 4-172927 | 6/1992 |
| JP | 8-068820 | 3/1996 |
| JP | 08-308115 | 11/1996 |
| JP | 2008-086069 | 4/2008 |
| JP | 2008-092655 | 4/2008 |
| JP | 2009038876 A * | 2/2009 |
| JP | 2009-288034 | 12/2009 |

OTHER PUBLICATIONS

Machine translation of JP 2009/038876 A, retrieved May 16, 2014, JPO AIPN.*
Japanese Office Action dated Mar. 18, 2014.

* cited by examiner

*Primary Examiner* — Patrick Assouad
*Assistant Examiner* — Sean Curtis
(74) *Attorney, Agent, or Firm* — IPUSA, PLLC

(57) ABSTRACT

A battery voltage monitoring circuit includes a first power supply terminal to be connected to the positive terminal of a battery pack having rechargeable cells connected in series; a first supply voltage sensing terminal to be connected to the positive terminal of the battery pack; a first resistor connected between the first power supply terminal and the first supply voltage sensing terminal; a second supply voltage sensing terminal to be connected to the negative terminal of a first rechargeable cell of the rechargeable cells, the first rechargeable cell being on the positive terminal side of the battery pack and connected to the positive terminal of the battery pack; a second resistor connected between the second supply voltage sensing terminal and the first power supply terminal; and a first comparator configured to compare a voltage at the first power supply terminal and a voltage at the first supply voltage sensing terminal.

3 Claims, 18 Drawing Sheets

BATTERY VOLTAGE MONITORING CIRCUIT

CROSS-REFERENCE TO RELATED APPLICATION

The present application is based upon and claims the benefit of priority of Japanese Patent Application No. 2010-248213, filed on Nov. 5, 2010, the entire contents of which are incorporated herein by reference.

BACKGROUND OF THE INVENTION

1. Field of the Invention

The present invention relates to a battery voltage monitoring circuit that monitors the battery voltage of multiple rechargeable batteries connected in series.

2. Description of the Related Art

In recent years, portable devices such as digital cameras include lithium-ion batteries as rechargeable batteries. Lithium-ion batteries are easily affected by overcharge and overdischarge, so that it is necessary to provide a protection circuit for overcharge and overdischarge.

In the case of using multiple lithium-ion batteries (cells) connected in series as a single battery pack, in order for the protection circuit to properly detect the overcharge voltage and overdischarge voltage of each of the lithium-ion batteries, there should be no open circuit in the connection between the batteries and the protection circuit, and if there is an open circuit, such control as the prevention of charge and discharge is necessary. Further, if there is reduction in battery voltage for some reason, it is necessary to prevent subsequent charging, which is unsafe.

A technique is known where a charge and discharge control circuit for a rechargeable battery having two or more cells connected in series has voltage divider circuits connected to the respective cells; the divided voltages are detected in voltage detector circuits; the voltages of the voltage detector circuits change in response to the cells becoming overdischarged or overcharged; their signals are input to a control circuit so that a signal is output to a switch circuit provided in a power supply unit to stop overdischarge or overcharge; and a constant current circuit is added in order to detect the disconnection of the connection of the cells and the charge and discharge control circuit. (See, for example, Japanese Laid-Open Patent Application No. 8-308115.)

Further, a technique is known where in a battery pack monitoring apparatus that detects the presence or absence of an open circuit in interconnects led out from a battery pack having multiple cells connected in series, auxiliary current paths having set resistance values are connected in parallel to the respective cells, and the presence or absence of an open circuit is detected based on a detection voltage at the time of closing switch units for auxiliary current paths. (See, for example, Japanese Laid-Open Patent Application No. 2009-288034.)

SUMMARY OF THE INVENTION

According to an aspect of the present invention, a battery voltage monitoring circuit includes a first power supply terminal to be connected to a positive terminal of a battery pack having a plurality of rechargeable cells connected in series; a first supply voltage sensing terminal to be connected to the positive terminal of the battery pack; a first resistor connected between the first power supply terminal and the first supply voltage sensing terminal; a second supply voltage sensing terminal to be connected to a negative terminal of a first rechargeable cell of the rechargeable cells, the first rechargeable cell being on a positive terminal side of the battery pack and connected to the positive terminal of the battery pack; a second resistor connected between the second supply voltage sensing terminal and the first power supply terminal; and a first comparator configured to compare a voltage at the first power supply terminal and a voltage at the first supply voltage sensing terminal.

The object and advantages of the present invention will be realized and attained by means of the elements and combinations particularly pointed out in the claims.

It is to be understood that both the foregoing general description and the following detailed description are exemplary and explanatory and not restrictive of the invention as claimed.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

However, the conventional battery voltage monitoring circuit is prevented from detecting an open circuit in a part connecting the positive terminal of a battery pack and the power supply terminal VDD of the battery voltage monitoring circuit and an open circuit in a part connecting the negative terminal of the battery pack and the power supply terminal VSS of the battery voltage monitoring circuit. Therefore, there is a problem in that it is impossible to perform control such as the prevention of charge and discharge in the case of the occurrence of an open circuit in the connecting part of the power supply terminal VDD or VSS.

According to an aspect of the present invention, a battery pack monitoring circuit is provided that detects an open circuit in a part connecting an electrode terminal of a battery pack and a power supply terminal of a battery voltage monitoring circuit.

A description is given below, with reference to the accompanying drawings, of an embodiment of the present invention.

First, a description is given of a circuit configuration according to the embodiment of the present invention.

Figure 1:
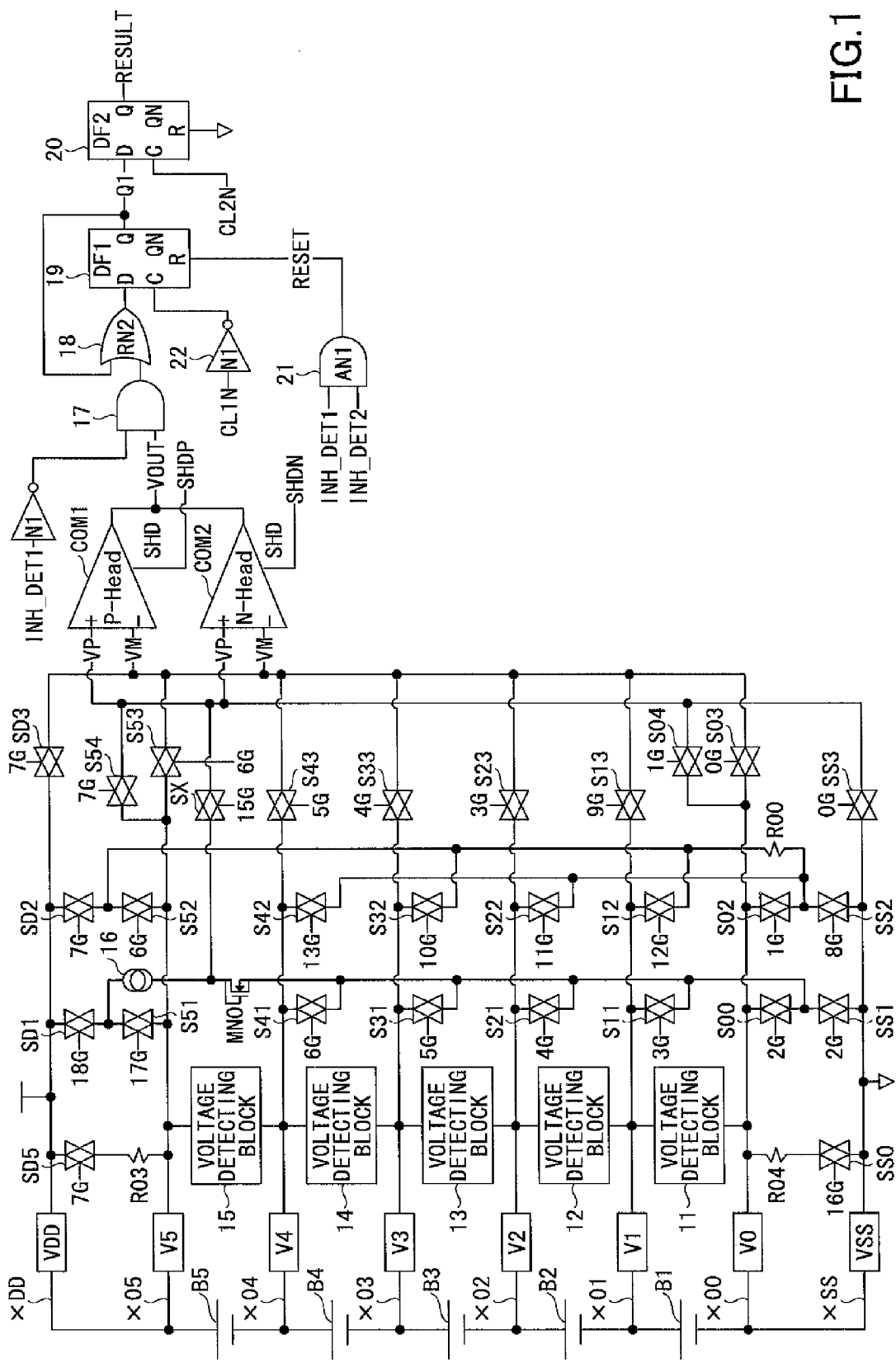
FIG. 1 is a circuit configuration diagram illustrating a battery voltage monitoring circuit according to an embodiment of the present invention.
Figure 2:
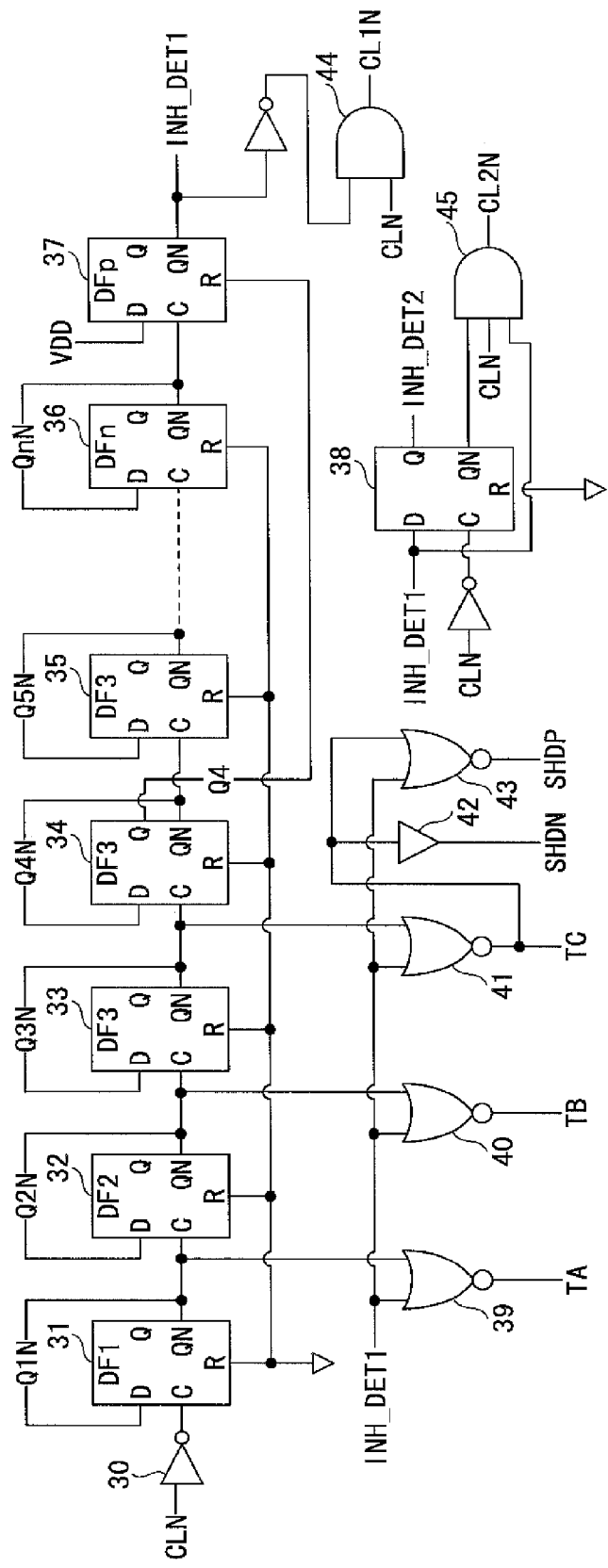
FIG. 2 is another circuit configuration diagram illustrating the battery voltage monitoring circuit according to the embodiment of the present invention.
Figure 3:
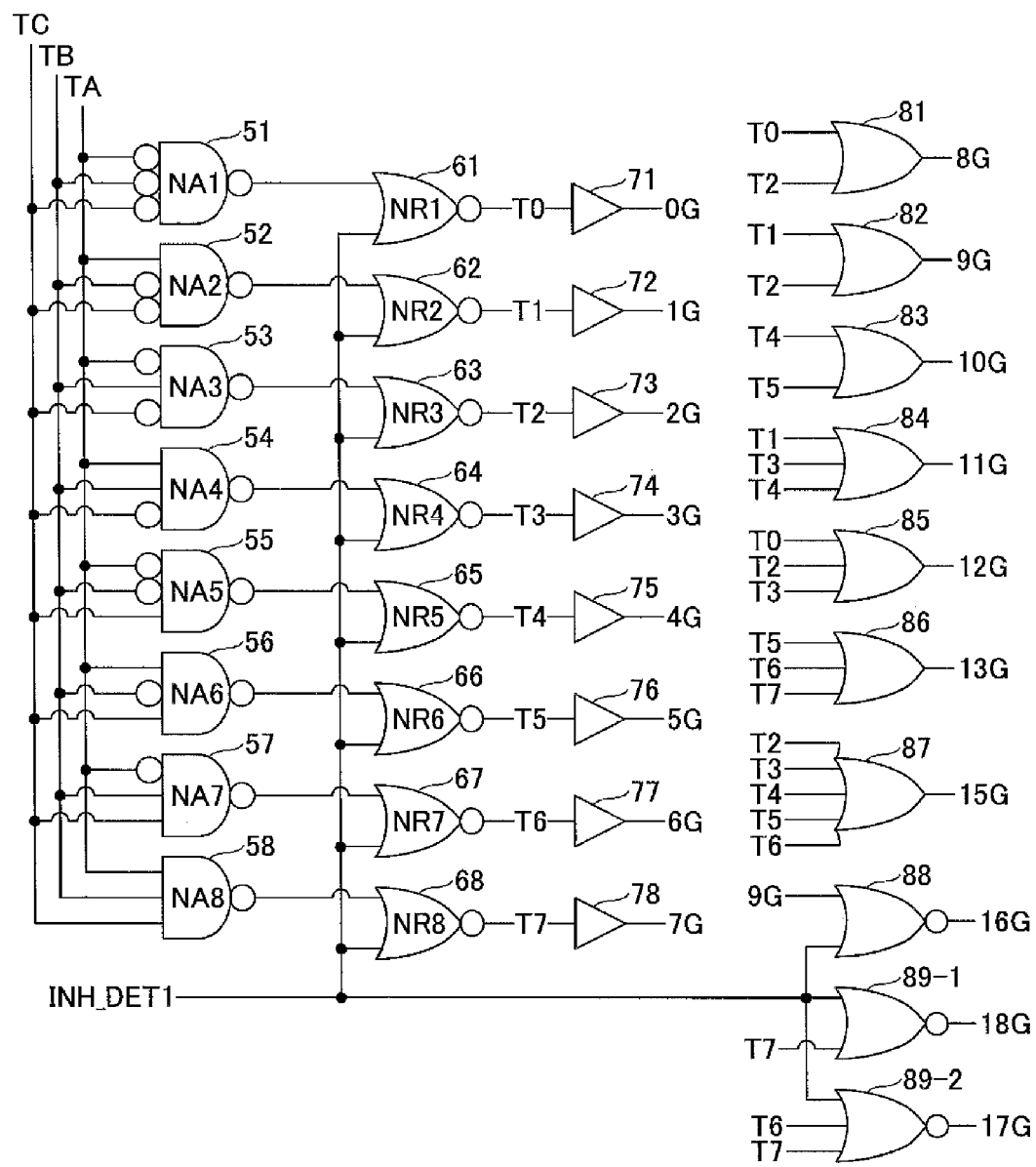
FIG. 3 is yet another circuit configuration diagram illustrating the battery voltage monitoring circuit according to the embodiment of the present invention.

FIG. 1 through FIG. 3 are circuit configuration diagrams illustrating a battery voltage monitoring circuit according to the embodiment of the present invention. The entire battery voltage monitoring circuit is a semiconductor integrated circuit. In FIG. 1, lithium-ion cells (batteries) B1 through B5, which are rechargeable cells, are connected in series to form a battery pack. The negative terminal of the battery pack, that is, the negative terminal of the lithium-ion cell B1, is connected to a power supply terminal VSS and a supply voltage sensing terminal V0 of the battery voltage monitoring circuit. The positive terminal of the lithium-ion cell B1 is connected to the negative terminal of the lithium-ion cell B2 and a supply voltage sensing terminal V1 of the battery voltage monitoring circuit. The positive terminal of the lithium-ion cell B2 is connected to the negative terminal of the lithium-ion cell B3 and a supply voltage sensing terminal V2 of the battery voltage monitoring circuit. The positive terminal of the lithium-ion cell B3 is connected to the negative terminal of the lithium-ion cell B4 and a supply voltage sensing terminal V3 of the battery voltage monitoring circuit. The positive terminal of the lithium-ion cell B4 is connected to the negative terminal of the lithium-ion cell B5 and a supply voltage sensing terminal V4 of the battery voltage monitoring circuit. The positive terminal of the battery pack, that is, the positive terminal of the lithium-ion cell 55, is connected to a power supply terminal VDD and a supply voltage sensing terminal V5 of the battery voltage monitoring circuit.

The power supply terminal VDD is connected via an analog switch SD3 to inverting inputs VM of comparators COM1 and COM2. The supply voltage sensing terminal V5 is connected via an analog switch S53 to the inverting inputs VM of the comparators COM1 and COM2 and is connected via an analog switch S54 to non-inverting inputs VP of the comparators COM1 and COM2. The power supply terminal VDD and the supply voltage sensing terminal V5 are connected by a series circuit of an analog switch SD5 and a resistor R03, are connected by a series circuit of an analog switch SD1 and an analog switch S51, and are further connected by a series circuit of an analog switch SD2 and an analog switch S52. An end of the analog switch S54 is connected to the connecting point of the analog switch S52 and the analog switch S53.

The supply voltage sensing terminal V4 is connected via an analog switch S43 to the inverting inputs VM of the comparators COM1 and COM2. Further, a voltage detecting block 15 as a protection circuit is connected between the supply voltage sensing terminals V5 and V4.

The supply voltage sensing terminal V3 is connected via an analog switch S33 to the inverting inputs VM of the comparators COM1 and COM2. Further, a voltage detecting block 14 as a protection circuit is connected between the supply voltage sensing terminals V4 and V3.

The supply voltage sensing terminal V2 is connected via an analog switch S23 to the inverting inputs VM of the comparators COM1 and COM2. Further, a voltage detecting block 13 as a protection circuit is connected between the supply voltage sensing terminals V3 and V2.

The supply voltage sensing terminal V1 is connected via an analog switch S13 to the inverting inputs VM of the comparators COM1 and COM2. Further, a voltage detecting block 12 as a protection circuit is connected between the supply voltage sensing terminals V2 and V1.

The supply voltage sensing terminal V0 is connected via an analog switch S03 to the inverting inputs VM of the comparators COM1 and COM2 and is connected via an analog switch S04 to the non-inverting inputs VP of the comparators COM1 and COM2. Further, a voltage detecting block 11 as a protection circuit is connected between the supply voltage sensing terminals V1 and V0.

The power supply terminal VSS is connected via an analog switch SS3 to the non-inverting inputs VP of the comparators COM1 and COM2. The power supply terminal VSS and the supply voltage sensing terminal V0 are connected by a series circuit of a resistor R04 and an analog switch SS0, are connected by a series circuit of an analog switch S00 and an analog switch SS1, and are further connected by a series circuit of an analog switch S02 and an analog switch SS2. An end of the analog switch S04 is connected to the connecting point of the analog switch S02 and the analog switch S03.

An end of a constant current circuit 16 is connected to the connecting point of the analog switch SD1 and the analog switch S51. The other end of the constant current circuit 16 is connected to the drain and the gate of an n-channel MOS transistor MN0 and is connected via an analog switch SX to the non-inverting inputs VP of the comparators COM1 and COM2. The source of the MOS transistor MN0 is connected to the supply voltage sensing terminal V4 via an analog switch S41, to the supply voltage sensing terminal V3 via an analog switch S31, to the supply voltage sensing terminal V2 via an analog switch S21, to the supply voltage sensing terminal V1 via an analog switch S11, and to the connecting point of the analog switches S00 and SS1.

An end of a resistor R00 is connected to the connecting point of the analog switch SD2 and the analog switch S52, to the supply voltage sensing terminal V3 via an analog switch S32, and to the supply voltage sensing terminal V1 via an analog switch S12. The other end of the resistor R00 is connected to the supply voltage sensing terminal V4 via an analog switch S42, to the supply voltage sensing terminal V2 via an analog switch S22, and to the connecting point of the analog switches S02 and SS2.

In FIG. 1, xDD, x05, x04, x03, x02, x01, x00, and xSS denote parts connecting the lithium-ion cells B5 through B1 and the terminals VDD, V5, V4, V3, V2, V1, V0, and VSS, respectively.

The comparator COM1 is a p-head type (using a p-channel MOS transistor for a differential stage) so provided with an offset as to output a value of 0 if the inverting input VM equals the non-inverting input VP. The comparator COM2 is an n-head type (using an n-channel MOS transistor for a differential stage) so provided with an offset as to output a value of 0 if the inverting input VM equals the non-inverting input VP. The output signal VOUT of the comparator COM1 or COM2 (whose value becomes 1 at an abnormal time) is fed to a D-type flip-flop 19 via an AND circuit 17 and an OR circuit 18.

The D-type flip-flop 19 is reset in response to being fed with a signal RESET generated from a signal INH_DET1 and a signal INH_DET2 in an AND circuit 21, and captures the output of the OR circuit 18 in response to being fed with a signal that is the inverse of a signal CL1N from an inverter 22. The Q output of the D-type flip-flop 19 is fed back to the OR circuit 18 so that the D-type flip-flop 19 forms a latch circuit. A signal Q1, which is the Q output of the D-type flip-flop 19, is fed to a D-type flip-flop 20. The D-type flip-flop 20 captures the signal Q1 in response to being fed with a signal CL2N. The Q output of the D-type flip-flop 20 is output as a signal RESULT.

Referring to FIG. 2, a clock signal CLN of a frequency of, for example, 1 kHz is fed to the clock input of a D-type flip-flop 31 via an inverter 30. The D-type flip-flop 31 and D-type flip-flops 32 through 37 are in cascade connection, and the D-type flip-flops 31 through 36 divide the frequencies of their respective input signals by two by having their respective QN outputs (inverted Q outputs) fed back to their respective D inputs. The output signal INH_DET1 of the D-type flip-flop 37 has its phase shifted by one clock in a D-type flop-flop 38 to be output from the D-type flip-flop 38 as the signal INH_DET2.

NOR circuits 39, 40, and 41 generate signals TA, TB, and TC, respectively, from the output signals of the D-type flip-flops 31 through 33 and the signal INH_DET1. A buffer 42 outputs the signal TC as a signal SHDN. A NOR circuit 43 generates a signal SHDP from the signal TC and the signal INH_DET1. An AND circuit 44 generates the signal OLIN from a signal that is the inverse of the signal INH_DET1 and the clock signal CLN. An AND circuit 45 generates the signal CL2N from the signal INH_DET1, the clock signal CLN, and a signal that is the inverse of the signal INH_DET2.

Figure 4:
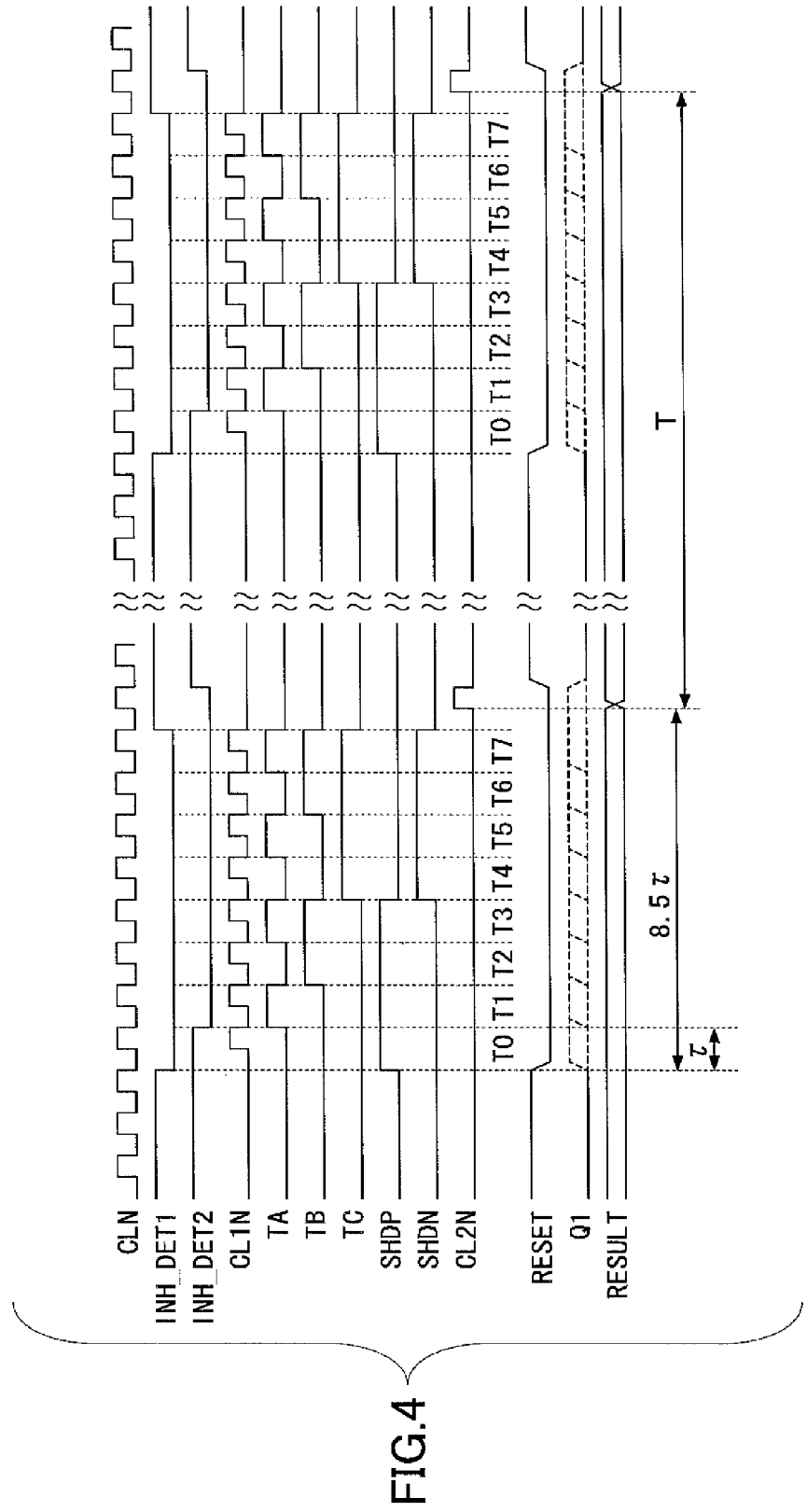
FIG. 4 is a timing chart of signals according to the embodiment of the present invention.

FIG. 4 illustrates a timing chart of the above-described signals CLN, INH_DET1, INH_DET2, CL1N, TA, TB, TC, SHDP, SHDN, CL2N, RESET, Q1, and RESULT.

Referring to FIG. 3, the signals TA, TB, and TC are fed to NAND circuits 51 through 58. NOR circuits 61 through 68 perform an operation on the outputs of the NAND circuits 51 through 58 and the signal INH_DET1 to generate signals T0 through T7, respectively. The signals T0 through T7 are output as signals 0G through 7G via buffers 71 through 78, respectively, and are also fed to OR circuits 81 through 87 and NOR circuits 88, 89-1, and 89-2, so that signals 8G through 13G and 15G through 18G are generated. These signals 0G through 13G and 15G through 18G are fed to the control terminals of the analog switches S00, S02 through S04, S11 through S13, S21 through S23, S31 through S33, S41 through S43, S51 through S54, SS0 through SS3, SD1 through SD3, SD5, and SX of FIG. 1. The analog switches S00, S02 through S04, S11 through S13, S21 through S23, S31 through S33, S41 through S43, S51 through S54, SS0 through SS3, SD1 through SD3, SD5, and SX allow conduction when being fed with a signal of a value of 1 and allow no conduction when being fed with a signal of a value of 0.

According to this embodiment, the middle terminals of the battery pack are connected to the battery voltage monitoring circuit in order to detect the voltages of the individual lithium-ion cells B1 through B5. If an open circuit occurs in the connections, corresponding voltage dividing resistors in the voltage detecting blocks 11 through 15 for the lithium-ion cells B1 through B5 are connected in series between the power supply terminals VDD and VSS of the battery voltage monitoring circuit.

Here, in order to cause the voltage between terminals having the open circuit to be abnormal, a resistor is connected between the terminals to lower voltage, and it is determined that there is an open circuit if the voltage is lower than a reference voltage VREF. If there is no open circuit, current is supplied from the lithium-ion cells B1 through B5 so that the voltage is maintained. Therefore, there is no reduction in voltage.

Accordingly, no voltage is generated by voltage division (due to the series connection of the voltage dividing resistors) at the supply voltage sensing terminal (V5, V4, V3, V3, V1, or V0) where the open circuit has occurred, so that it is possible to detect abnormality.

Further, an abnormal state is detected not only in the case of reduction in the voltage between terminals due to an open circuit but also in the case where the battery voltage becomes lower than or equal to the reference voltage VREF. Although there is no determining whether the abnormal state is due to an open circuit or a cell, it is possible to prevent subsequent charge and discharge because of the abnormal state.

According to this embodiment, the power supply terminals VDD and VSS and the supply voltage sensing terminals V5 and V0 are provided in order to detect an open circuit in the connecting parts xDD and xSS of the power supply terminals VDD and VSS.

Further, the resistor R03 and the analog switch SD5 are provided between the power supply terminal VDD and the supply voltage sensing terminal V5 in the semiconductor integrated circuit of the battery voltage monitoring circuit in order to prevent generation of such voltage as to cause current to flow in a forward direction in a parasitic diode between the power supply terminal VDD and the supply voltage sensing terminal V5 in the semiconductor integrated circuit at the time of the occurrence of an open circuit in the connecting part xDD. Likewise, the resistor R04 and the analog switch SS0 are provided between the power supply terminal VSS and the supply voltage sensing terminal V0 in the semiconductor integrated circuit of the battery voltage monitoring circuit in order to prevent generation of such voltage as to cause current to flow in a forward direction in a parasitic diode between the power supply terminal VSS and the supply voltage sensing terminal V0 in the semiconductor integrated circuit at the time of the occurrence of an open circuit in the connecting part xSS. Normally, these analog switches SD5 and SS0 are turned ON to prevent generation of such voltage as to cause current to flow in a forward direction in the parasitic diodes between the power supply terminals VDD and VSS and the supply voltage sensing terminals V5 and V0 because of an open circuit. The analog switch SD5 is turned OFF in time with detection of an open circuit in the connecting part xDD of the power supply terminal VDD and the analog switch SS0 is turned OFF in time with detection of an open circuit in the connecting part xSS of the power supply terminal VSS, thereby detecting the respective open circuits.

Further, in order to detect an open circuit, the resistor R00 is shared among the supply voltage sensing terminals V0 through V5, and the connection of the resistor R00 is switched with the analog switches S02 through S52 so that the resistor R00 is connected between adjacent two after adjacent two of the supply voltage sensing terminals V0 through V5 in a sequential manner.

Further, if there is an open circuit, the reference voltage VREF for determining the voltage between terminals lowered because of the connection of the resistor R00 is generated using the threshold Vth of the MOS transistor MN0, and like in open circuit detection, the terminal to be fed with the reference voltage VREF is sequentially switched and selected with the analog switches SD2, S52, SS2, S02, S12, S22, S32, and S42, and voltages are compared in the comparator COM1 or COM2.

Further, the reference voltage VREF is also used as a comparative voltage for detecting reduction in battery voltage.

Further, in order to accept inputs for comparison in a wide voltage range corresponding to the voltage across the power supply terminals VDD and VSS of the battery voltage monitoring circuit, the comparator COM1 including a differential-stage p-channel MOS transistor and the comparator COM2 including a differential-stage n-channel MOS transistor are provided, and the comparator to be used is switched in accordance with inputs.

It is assumed that in FIG. 1, the resistance values of the resistors R03 and R04 are, for example, 50 kΩ, the resistance value of the resistor R00 is, for example, 1 MΩ, the voltage dividing resistor for voltage detection in each of the voltage detecting blocks 11 through 15 has a resistance value of 5 MΩ, and a maximum charge voltage and a voltage for detecting voltage reduction for each of the lithium-ion cells B1 through B5 are 4.2 V and 2.6 V, respectively.

Next, a description is given of an equivalent circuit at the time of open circuit detection.

Figure 5:
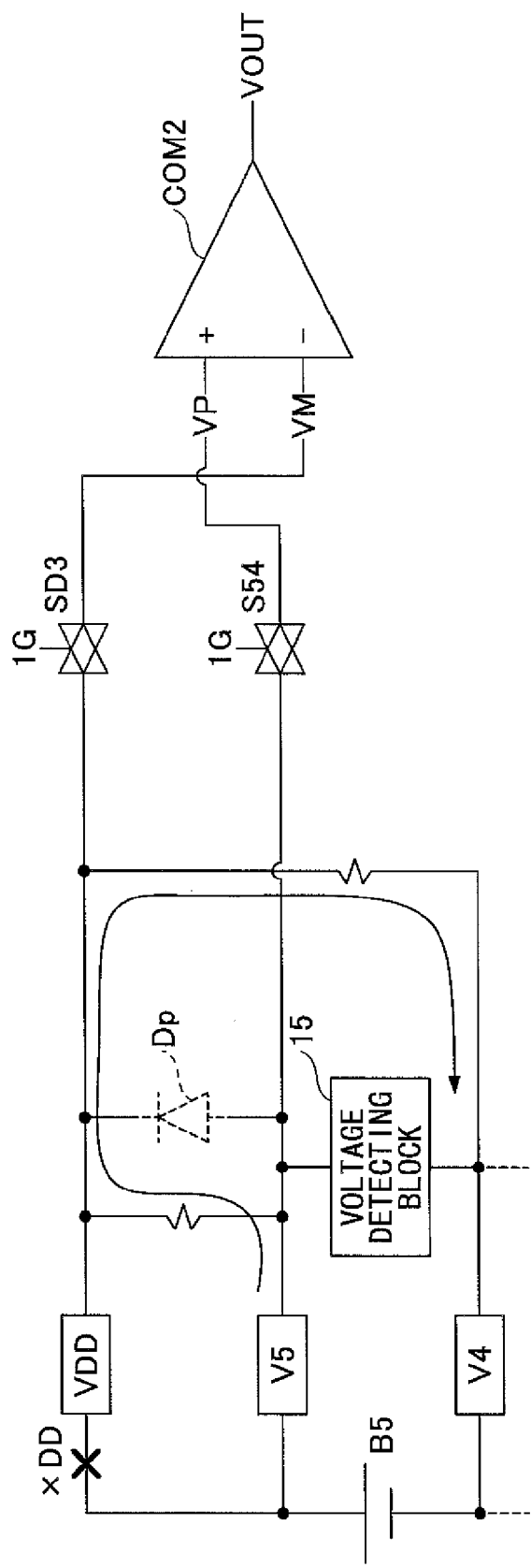
FIG. 5 is a diagram illustrating an equivalent circuit at the time of detection of an open circuit in the connecting part of a power supply terminal (VDD) according to the embodiment of the present invention.

FIG. 5 is a diagram illustrating an equivalent circuit at the time of detection of an open circuit in the connecting part xDD according to this embodiment. When there is an open circuit in the connecting part xDD, a differential voltage (VP−VM) in the comparator COM2 is determined by Eq. (1) as follows:

$$(VP-VM) = [(V5-V4)/(R03+R00)] \times R03 \quad (1)$$
$$= (V5-V4)/21,$$

where V4 and V5 are voltages at the supply voltage sensing terminals V4 and V5, respectively.

The differential voltage (VP−VM) depends on the battery voltage of the lithium-ion cell B5. The battery voltage is in the range of 2.6 V to 4.2 V. The differential voltage (VP−VM) is approximately 124 mV to approximately 200 mV, so that VOUT is 1. Thus, it is possible to perform determination with the comparator COM2. The voltage in a forward direction that causes a parasitic diode Dp between the power supply terminal VDD and the supply voltage sensing terminal V5 to be forward biased is higher than or equal to 200 mV, so that the parasitic diode Dp is not forward biased. Accordingly, an effect on other circuits is limited. If there is no open circuit in the connecting part xDD, the differential voltage (VP−VM) is substantially zero, so that VOUT is 0.

Figure 6:
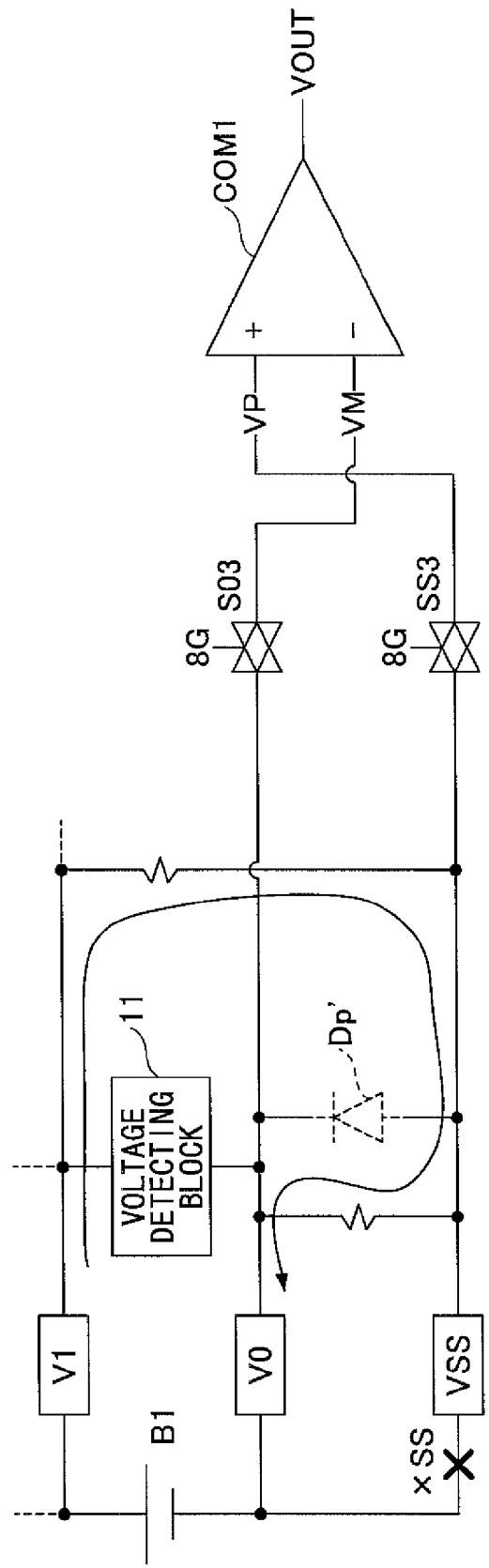
FIG. 6 is a diagram illustrating an equivalent circuit at the time of detection of an open circuit in the connecting part of a power supply terminal (VSS) according to the embodiment of the present invention.

FIG. 6 is a diagram illustrating an equivalent circuit at the time of detection of an open circuit in the connecting part xSS according to this embodiment. When there is an open circuit in the connecting part xSS, a differential voltage (VP−VM) in the comparator COM1 is determined by Eq. (2) as follows:

$$(VP-VM) = [(V1-V01)/(R04+R00)] \times R04 \quad (2)$$
$$= (V1-V0)/21,$$

where V0 and V1 are voltages at the supply voltage sensing terminals V0 and V1, respectively.

The differential voltage (VP−VM) depends on the battery voltage of the lithium-ion cell B1. The battery voltage is in the range of 2.6 V to 4.2 V. The differential voltage (VP−VM) is approximately 124 my to approximately 200 mV, so that VOUT is 1. Thus, it is possible to perform determination with the comparator COM1. The voltage in a forward direction that causes a parasitic diode Dp' between the power supply terminal VSS and the supply voltage sensing terminal V0 to be forward biased is higher than or equal to 200 mV, so that the parasitic diode Dp' is not forward biased. Accordingly, an effect on other circuits is limited. If there is no open circuit in the connecting part xSS, the differential voltage (VP−VM) is substantially zero, so that VOUT is 0.

Figure 7A:
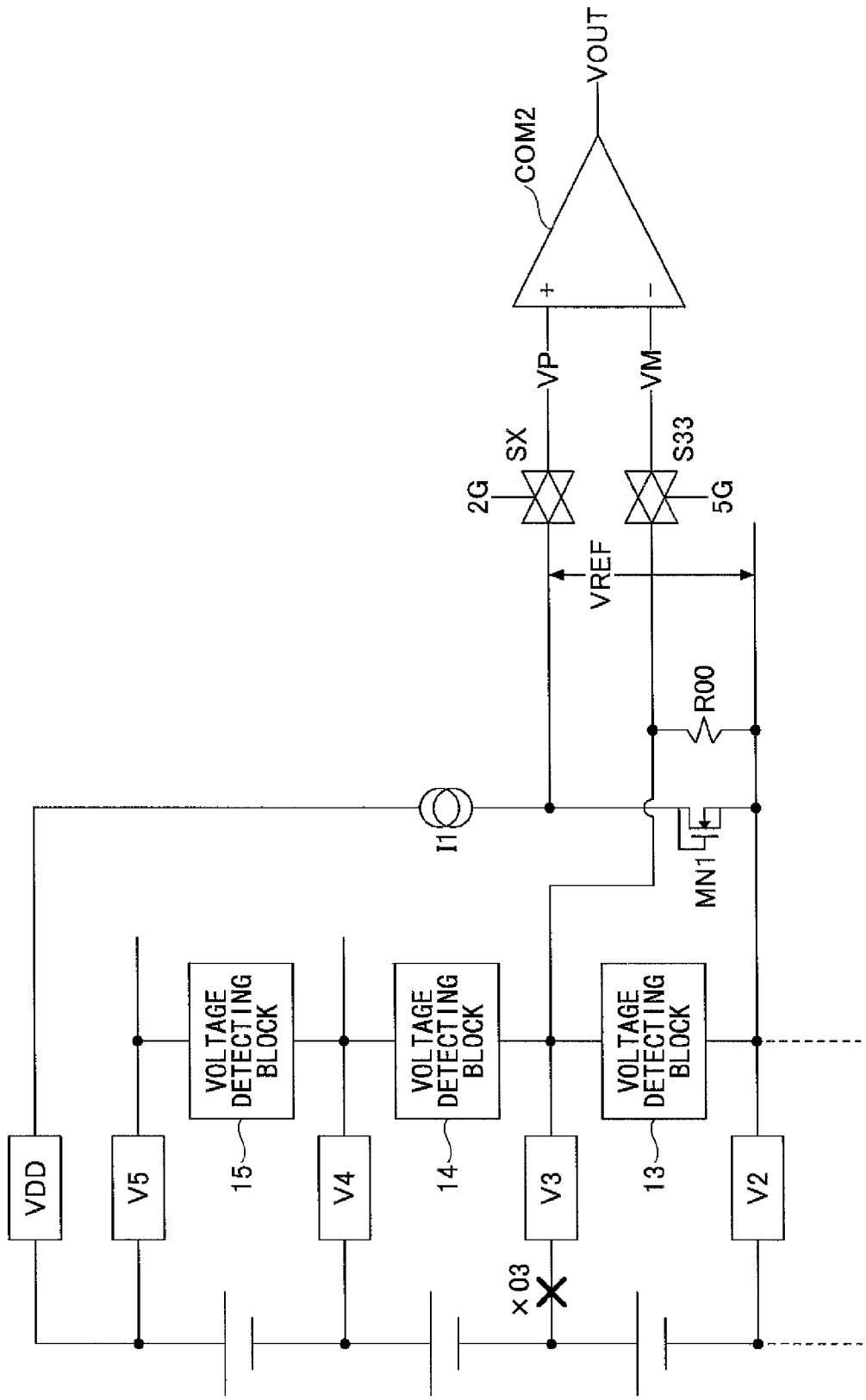
FIGS. 7A and 7B are diagrams illustrating an equivalent circuit at the time of detection of an open circuit in the connecting part of a supply voltage sensing terminal according to the embodiment of the present invention.
Figure 7B:
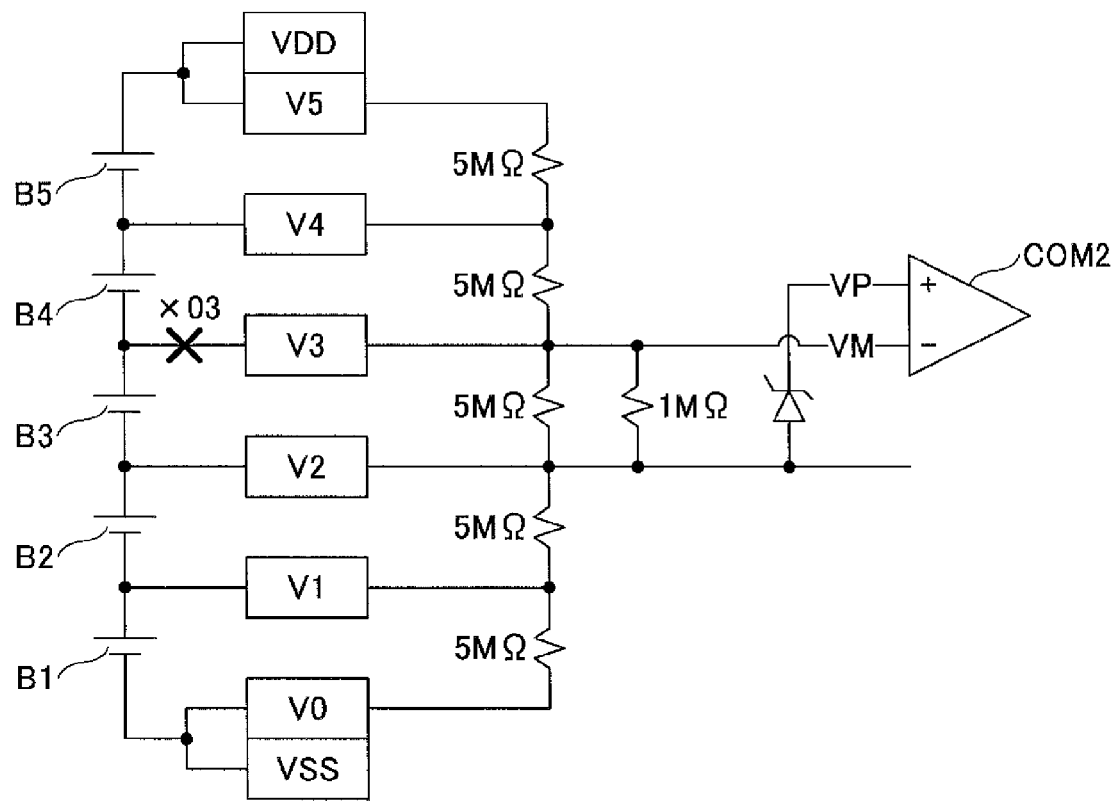

FIGS. 7A and 7B are diagrams illustrating an equivalent circuit at the time of detection of an open circuit in the connecting part x03 according to this embodiment. When there is an open circuit in the connecting part x03, the differential voltage (VP−VM) in the comparator COM2 is determined by Eq. (3) as follows:

$$VP-V2=VREF$$

$$VM-V2=\{5 \times VB/[5M \times 4+R00 \times 5M/(R00+5M)]\} \times R00 \times 5M/(R00+5M)$$

$$VP-VM=VREF-(5 \times VB/26), \quad (3)$$

where V2 is a voltage at the supply voltage sensing terminal V2, VB is the battery voltage (2.6 V to 4.2 V) of each of the lithium-ion cells B1 through B5, and the resistance value of each of the voltage detecting blocks 13, 14, and 15 is 5 MΩ.

It is assumed that there is an open circuit in the connecting part x03, VB is 4.2 V, and VREF is 1.0 V. In this case, VP−V2=1.0 V and VM−V2=0.81 V, so that VOUT is 1. If VB is 2.6 V and VREF is 1.0 V, VP−V2=1.0 V and VM−V2=0.5 V, so that VOUT is 1. That is, it is possible to detect an open circuit in the connecting part x03 with VB being in the range of 2.6 V to 4.2 V. In the case where there is no open circuit in the connecting part x03 and the battery voltage of the lithium-ion cell B3 is lower than the reference voltage VREF, VOUT is also 1, so that an abnormality is detected. There is no determining whether the abnormality is due to an open circuit or reduction in battery voltage, it is still possible to detect an abnormality. The subsequent prevention of charging is common to the open circuit and the battery voltage reduction. If there is no open circuit in the connecting part x03 and the battery voltage of the lithium-ion cell B3 is higher than or equal to the reference voltage VREF, VP is smaller than or equal to VM (VP≤VM), so that VOUT is 0.

Referring back to FIG. 4, the clock signal CLN has a period of τ (for example, 1 ms).

Period T0 is a period for detecting an open circuit in the connecting part xSS, in which the analog switches SS2, S12, SS3, S03, SD1, and S51 and the analog switch SS0 are turned ON (the other analog switches are turned OFF) and the comparator COM1 is enabled by SHDP=1. When there is an open circuit in the connecting part xSS, 200 mV>(VSS−V0)>124 mV, so that VP is greater than VM (VP>VM), thus resulting in VOUT=1.

Period T1 is a period for detecting an open circuit in the connecting part x00, in which the analog switches SD1, S51, S04, and S12 and the analog switches S02 and S22 are turned ON (the other analog switches are turned OFF) and the comparator COM1 is enabled by SHDP=1. When there is an open circuit in the connecting part x00, 200 mV>(VSS−V0)>124 mV and VP is greater than VM (VP>VM), thus resulting in VOUT=1.

Period T2 is a period for detecting an open circuit in the connecting part x01 and reduction in the battery voltage of the lithium-ion cell B1, in which the analog switches S00, SS1, SD1, S51, S13, and SX and the analog switches SS2 and S12 are turned ON (the other analog switches are turned OFF), and the comparator COM1 is enabled. When there is an open circuit in the connecting part x01 or there is reduction in the battery voltage of the lithium-ion cell B1, VP is greater than VM (VP>VM), thus resulting in VOUT=1.

Period T3 is a period for detecting an open circuit in the connecting part x02 and reduction in the battery voltage of the lithium-ion cell B2, in which the analog switches SS0, S11, SD1, S51, S23, and SX and the analog switches S12 and S22 are turned ON (the other analog switches are turned OFF), and the comparator COM1 is enabled. When there is an open circuit in the connecting part x02 or there is reduction in the battery voltage of the lithium-ion cell B2, VP is greater than VM (VP>VM), thus resulting in VOUT=1.

Period T4 is a period for detecting an open circuit in the connecting part x03 and reduction in the battery voltage of the lithium-ion cell B3, in which the analog switches SS0, S21, SD1, S51, S33, and SX and the analog switches S22 and S32 are turned ON (the other analog switches are turned OFF), and the comparator COM2 is enabled by SHDN=1. When there is an open circuit in the connecting part x03 or there is reduction in the battery voltage of the lithium-ion cell B3, VP is greater than VM (VP>VM), thus resulting in VOUT=1.

Period T5 is a period for detecting an open circuit in the connecting part x04 and reduction in the battery voltage of the lithium-ion cell 24, in which the analog switches SS0, S31, SD1, S51, S43, and SX and the analog switches S32 and S42 are turned ON (the other analog switches are turned OFF), and the comparator COM2 is enabled. When there is an open circuit in the connecting part x04 or there is reduction in the battery voltage of the lithium-ion cell B4, VP is greater than VM (VP>VM), thus resulting in VOUT=1.

Period T6 is a period for detecting an open circuit in the connecting part x05 and reduction in the battery voltage of the lithium-ion cell B5, in which the analog switches SS0, S41, SD1, S53, and SX and the analog switches S42 and S52 are turned ON (the other analog switches are turned OFF), and the comparator COM2 is enabled. When there is an open circuit in the connecting part x05 or there is reduction in the battery voltage of the lithium-ion cell B5, VP is greater than VM (VP>VM), thus resulting in VOUT=1.

Period T7 is a period for detecting an open circuit in the connecting part xDD, in which the analog switches SS0, S42, SD2, SD3, and S54 and the analog switch SD5 are turned ON (the other analog switches are turned OFF), and the comparator COM2 is enabled. When there is an open circuit in the connecting part xDD, 200 mV>(V5−VSS)>124 mV and VP is greater than VM (VP>VM), thus resulting in VOUT=1.

Detection of an open circuit in the connecting part and reduction in the battery voltage of a lithium-ion cell is performed in each of Periods T0 through T7. If VOUT is 1 (VOUT=1) in any one of Periods T0 through T7, the signal Q1, which is the Q output of the flip-flop 19, becomes 1 (Q1=1). The state of Q1=1 is retained by circulation through the OR circuit 18, and is read into the D-type flip-flop 20 at a rise of the signal CL2N to be retained until a detection time after an interval of one period indicated by T in FIG. 4.

In Periods T0, T1, and T2, the resistor R00 is connected to the lithium-ion cell B1. In Period T3, the resistor R00 is connected to the lithium-ion cell B2. In Period T4, the resistor R00 is connected to the lithium-ion cell B3. In Period T5, the resistor R00 is connected to the lithium-ion cell B4. In Periods T6 and T7, the resistor R00 is connected to the lithium-ion cell B5. In terms of time, the ratio of connection is 3/8 for the lithium-ion cell B1, 1/8 for each of the lithium-ion cells B2 through B4, and 2/8 for the lithium-ion cell B5. An examination is made as to whether this could form part of the leakage currents of the lithium-ion cells B1 through B5 to cause battery capacity imbalance.

It is assumed that the battery voltage is 4.2 V, the resistance value of the resistor R00 is 1 MΩ, and the period of detection is 1 s. In this case, the average leakage current for the detection of the lithium-ion cell B1 is (4.2 V/1 MΩ)×(3/1000) =12.6 nA, the average leakage current for the detection of each of the lithium-ion cells B2 through B4 is (4.2 V/1 MΩ)× (1/1000)=4.2 nA, and the average leakage current for the detection of the lithium-ion cell B5 is (4.2 V/1 MΩ)×(2/1000) =8.4 nA. These are extremely small compared with the actual leakage currents of the lithium-ion cells B1 through B5, and therefore do not cause battery imbalance.

A description is given of the power supply of a logic circuit block.

A power supply provided for a logic circuit block 90 (FIGS. 8A through 8E and FIGS. 9A through 9E) drives the logic circuit 90 at low voltage in order to reduce the area occupied by the semiconductor integrated circuit. The logic circuit block 90 includes the analog switches SS0 through SS3, SD1 through SD3, SD5, S00, S02 through S04, S11 through S13, S21 through S23, S31 through S33, S41 through S43, S51 through S54, and SX; the constant current circuit 16; the AND circuits 17, 21, 44, and 45; the OR circuits 18 and 81 through 87; the D-type flip-flops 19, 20, and 31 through 38; the inverters 22 and 30; the NOR circuits 39 through 41, 43, 61 through 68, 88, 89-1, and 89-2; the buffers 42 and 71 through 78; and the NAND circuits 51 through 58 of the battery voltage monitoring circuit as illustrated in FIG. 1 through FIG. 3. However, use of a specific one or more of the lithium-ion cells B1 through B5 in the battery pack as a supply source causes voltage imbalance in the lithium-ion cells B1 through B5 in the battery pack. Therefore, a low voltage for driving the logic circuit block 90 is generated using the voltage of the battery pack as a supply source.

In this case, if the power supply terminals VDD and VSS are the only terminals that connect the low voltage source and the battery pack, an open circuit in one of the connections prevents voltage from being supplied to the logic circuit block 90, thus preventing the logic circuit block 90 from functioning.

Therefore, as illustrated in FIGS. 8A through 8E, p-channel MOS transistors MP1, MP2, and MP3 and n-channel MOS transistors MN1 and MN2 are disposed between a set of a Zener diode Dz, which is a low voltage source, and the logic circuit block 90 and a set of the power supply terminals VDD and VSS and between the set of the Zener diode Dz and the logic circuit block 90 and a set of the supply voltage sensing terminals V5 and V0. This increases the safety of the Zener diode Dz serving as the power supply of the logic circuit block 90 and makes it possible to detect an open circuit.

FIGS. 8A through 8E illustrate cases where the low voltage source (the Zener diode Dz) uses a voltage at the power supply terminal VDD as a reference. A terminal 91 is a supply terminal of low voltage. The signals 6G and 7G generated as illustrated in FIG. 3, a signal 1GN (the inverted signal of 1G illustrated in FIG. 3), and a signal 0GN (the inverted signal of 0G illustrated in FIG. 3) are fed to the gates of the MOS transistors MP1, MP2, MN1, and MN2, respectively.

Figure 8A:
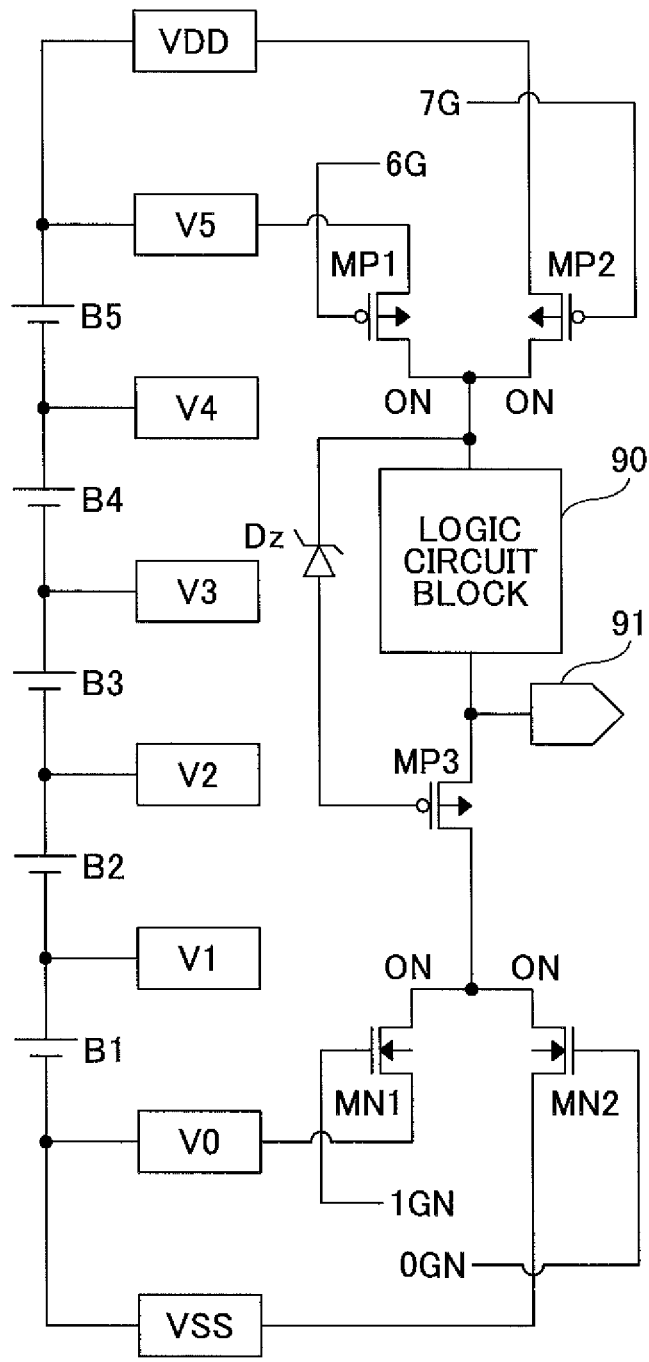
FIGS. 8A through 8E are circuit configuration diagrams illustrating power supply circuits for a logic circuit block according to the embodiment of the present invention.
Figure 8B:
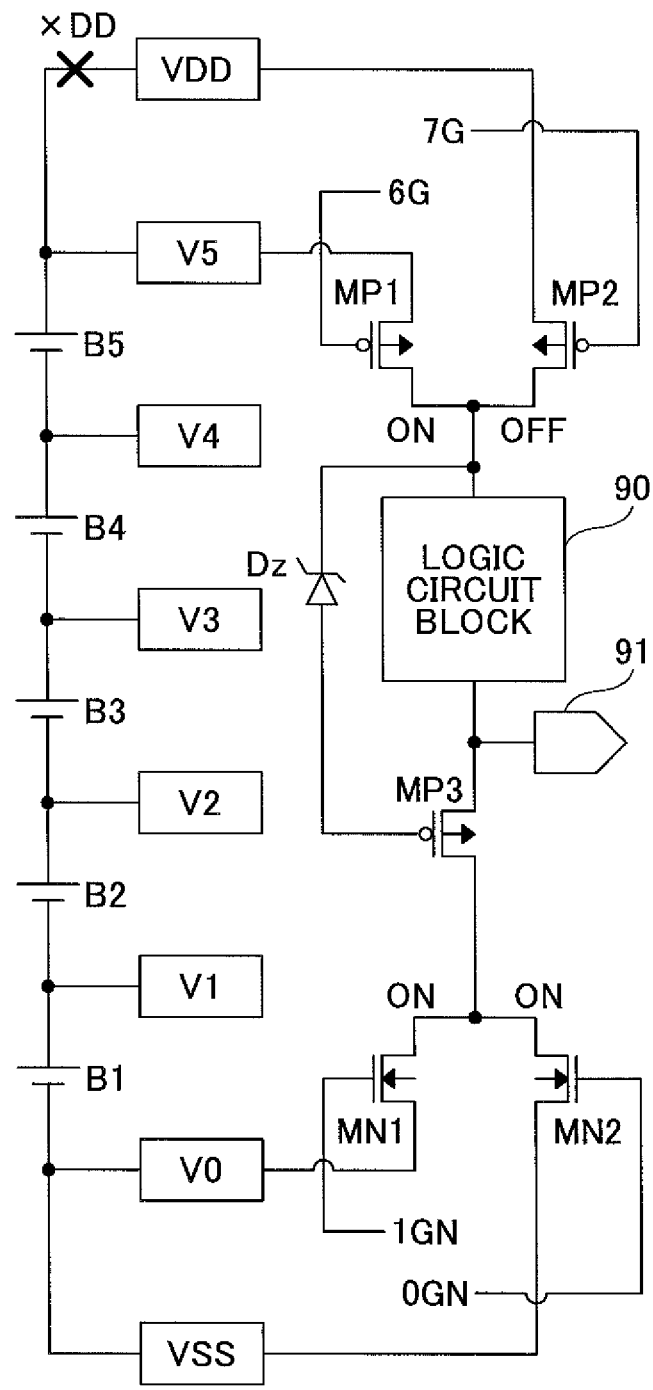
Figure 8C:
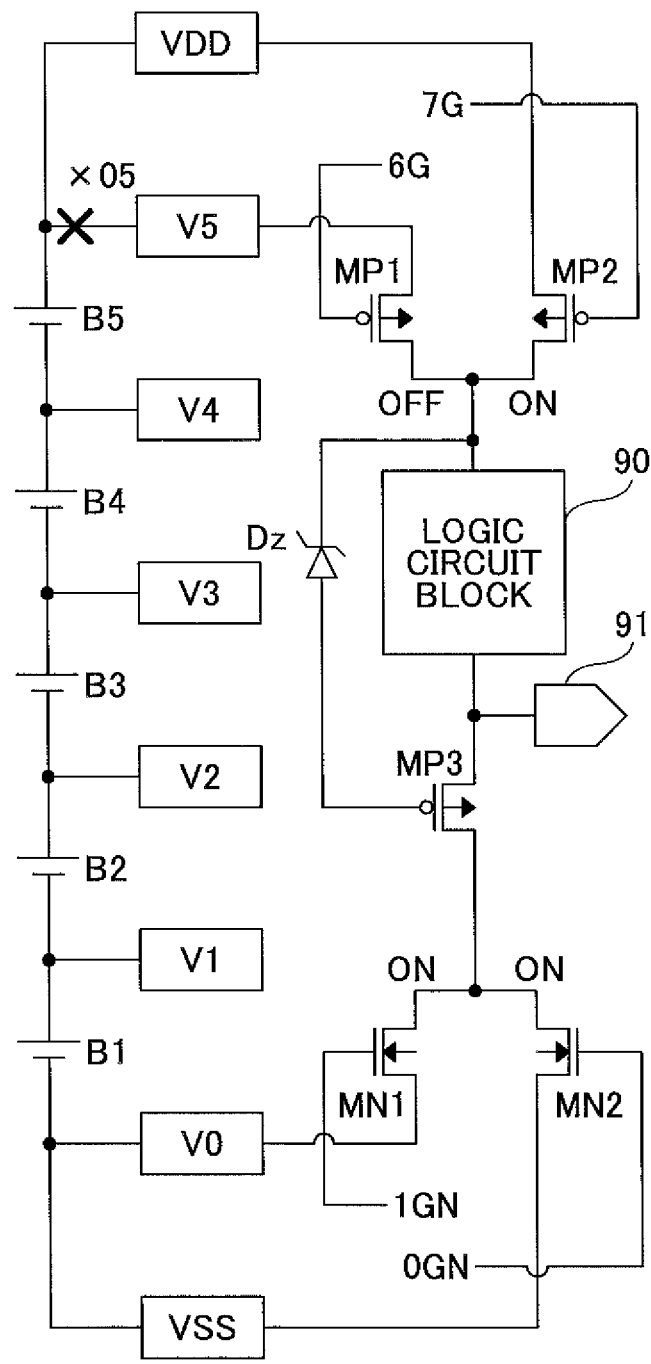
Figure 8D:
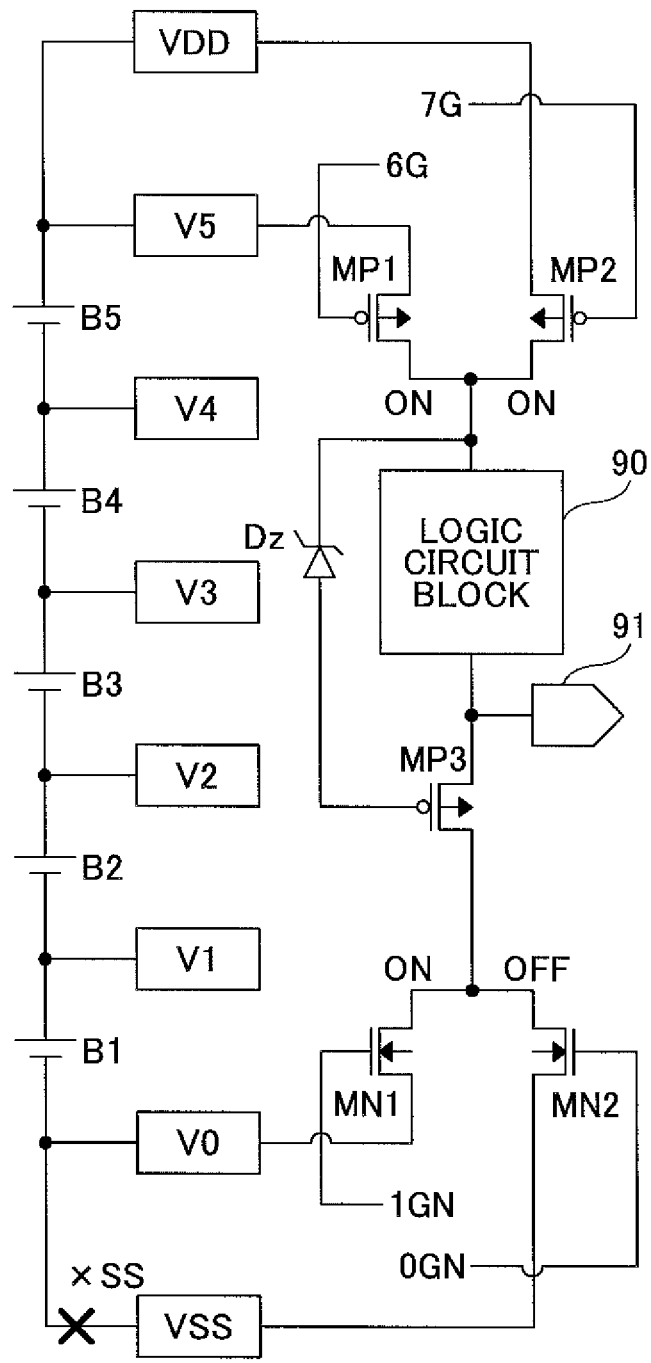

FIG. 8A illustrates a supply channel of low voltage power at a normal time when the connection lines of the power supply terminals VDD and VSS conduct electricity (with the MOS transistors MP1, MP2, MN1, and MN2 turned ON). FIG. 8B illustrates a supply channel of low voltage power at the time of detection of an open circuit in the connection line of the power supply terminal VDD (with the MOS transistors MP1, MN1, and MN2 turned ON and the MOS transistor MP2 turned OFF). FIG. 8C illustrates a supply channel of low voltage power at the time of detection of an open circuit in the connection line of the supply voltage sensing terminal V5 (with the MOS transistors MP2, MN1, and MN2 turned ON and the MOS transistor MP1 turned OFF). FIG. 8D illustrates a supply channel of low voltage power at the time of detection of an open circuit in the connection line of the power supply terminal VSS (with the MOS transistors MP1, MP2, and MN1 turned ON and the MOS transistor MN2 turned OFF).

Figure 8E:
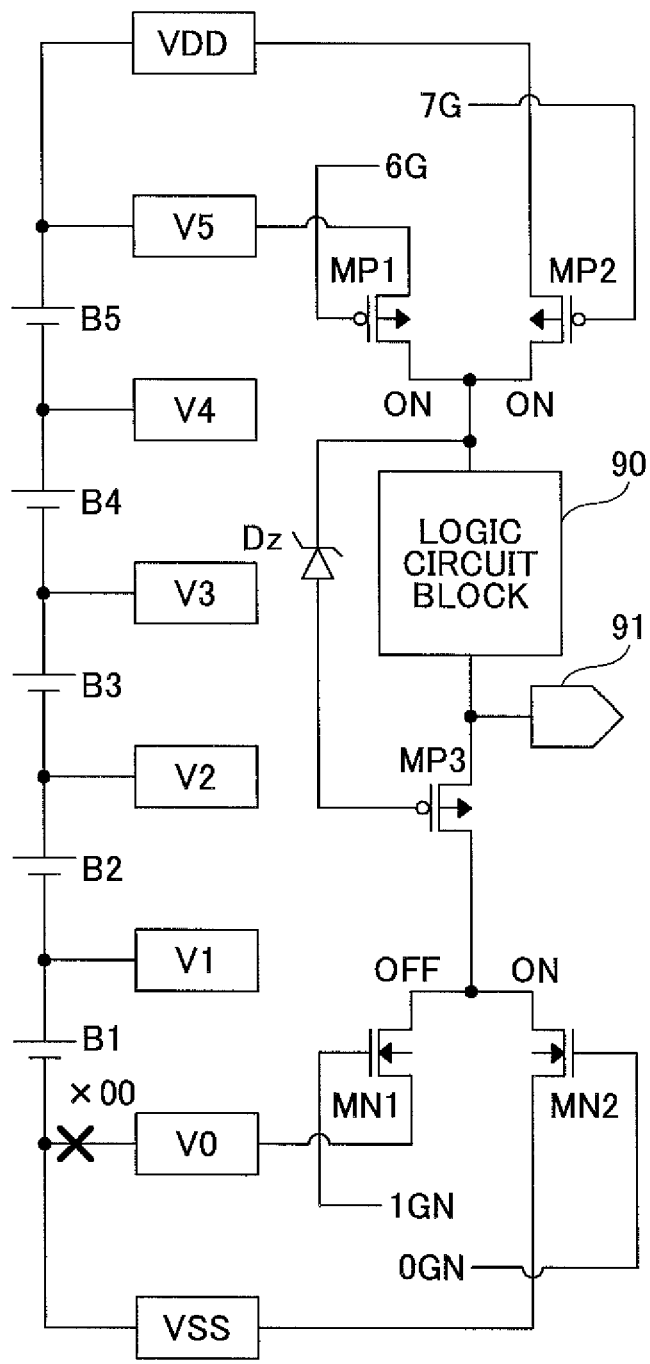

FIG. 8E illustrates a supply channel of low voltage power at the time of detection of an open circuit in the connection line of the supply voltage sensing terminal V0 (with the MOS transistors MP1, MP2, and MN2 turned ON and the MOS transistor MN1 turned OFF).

Alternatively, as illustrated in FIGS. 9A through 9E, the p-channel MOS transistors MP1 and MP2, the n-channel MOS transistors MN1 and MN2, and an n-channel MOS transistor MN3 may be disposed between a set of the Zener diode Dz, which is a low voltage source, and the logic circuit block 90 and a set of the power supply terminals VDD and VSS and between the set of the Zener diode Dz and the logic circuit block 90 and a set of the supply voltage sensing terminals V5 and V0. This increases the safety of the Zener diode Dz serving as the power supply of the logic circuit block 90 and makes it possible to detect an open circuit.

FIGS. 9A through 9E illustrate cases where the low voltage source (the Zener diode Dz) uses a voltage at the power supply terminal VSS as a reference. A terminal 92 is a supply terminal of low voltage. The signals 6G and 7G generated as illustrated in FIG. 3, the signal 1GN (the inverted signal of 1G), and the signal 0GN (the inverted signal of 0G) are fed to the gates of the MOS transistors MP1, MP2, MN1, and MN2, respectively.

Figure 9A:
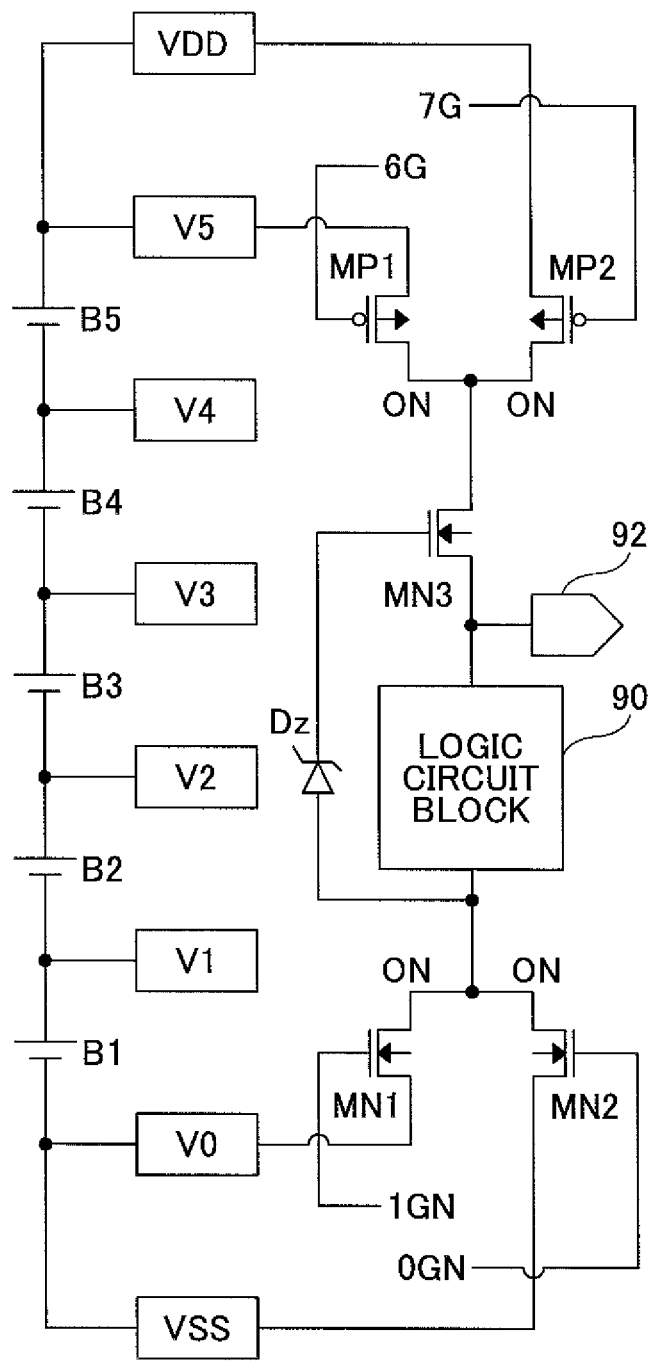
FIGS. 9A through 9E are circuit configuration diagrams illustrating power supply circuits for the logic circuit block according to the embodiment of the present invention.
Figure 9B:
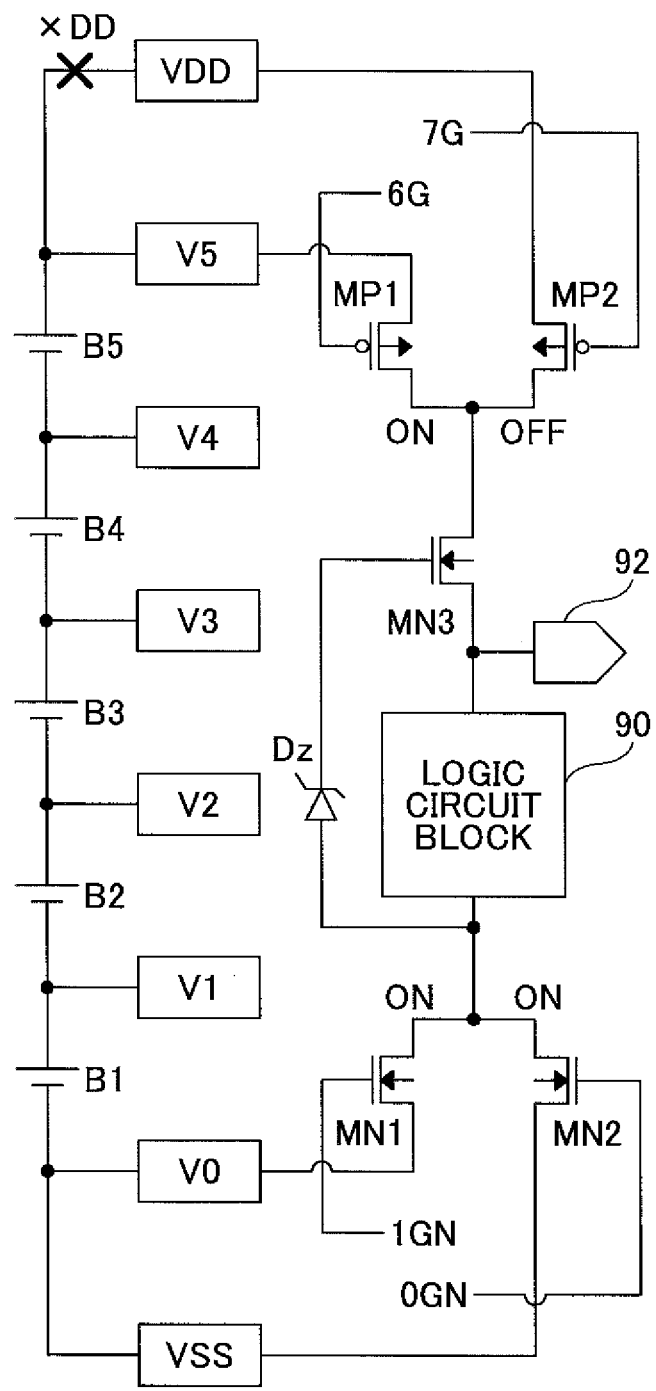
Figure 9C:
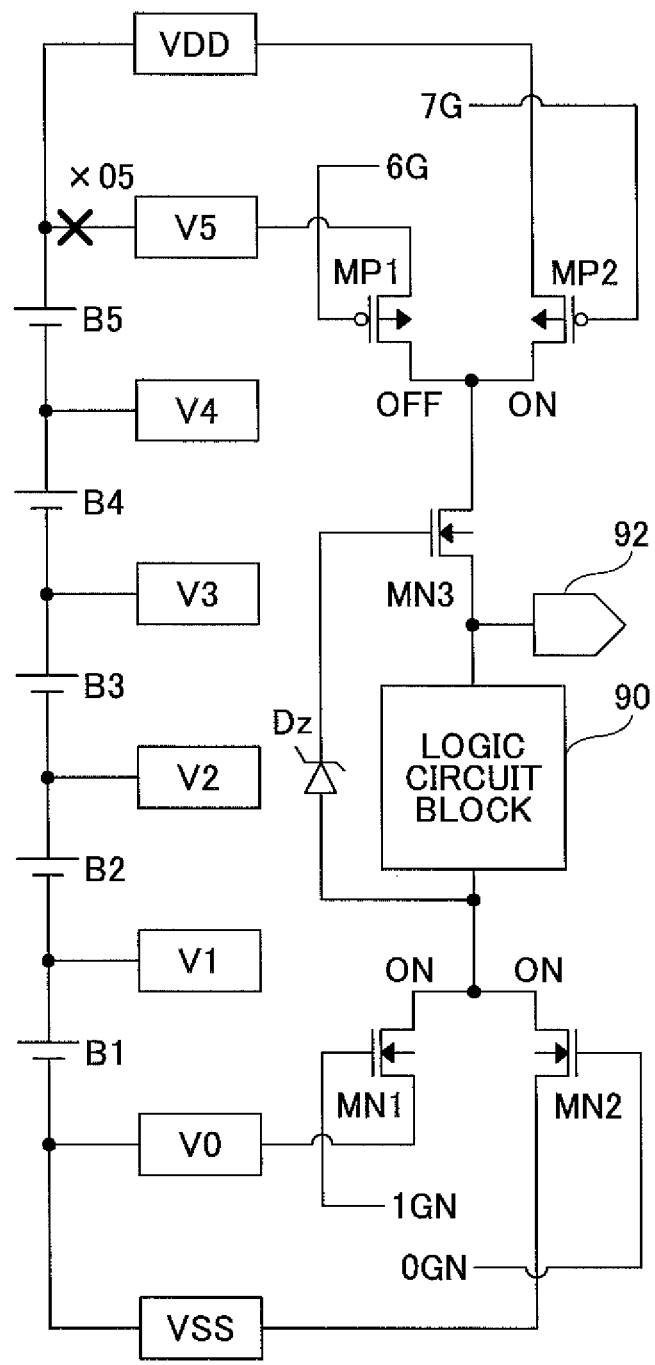
Figure 9D:
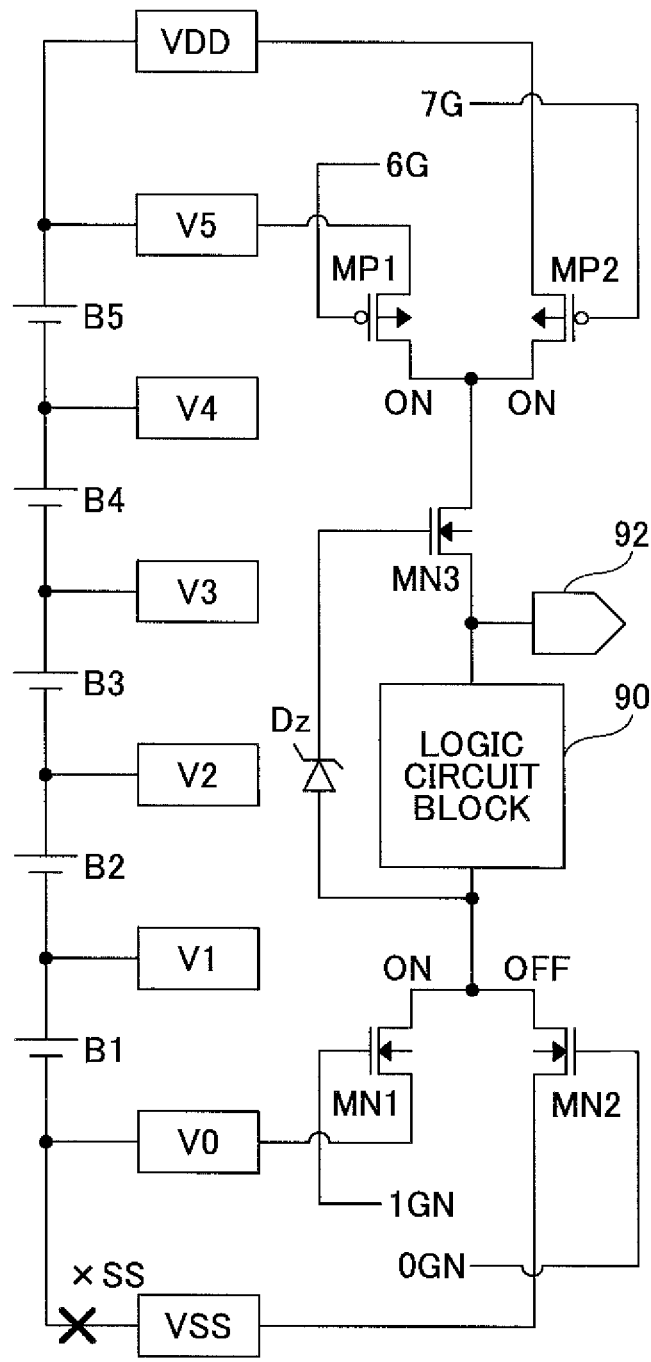
Figure 9E:
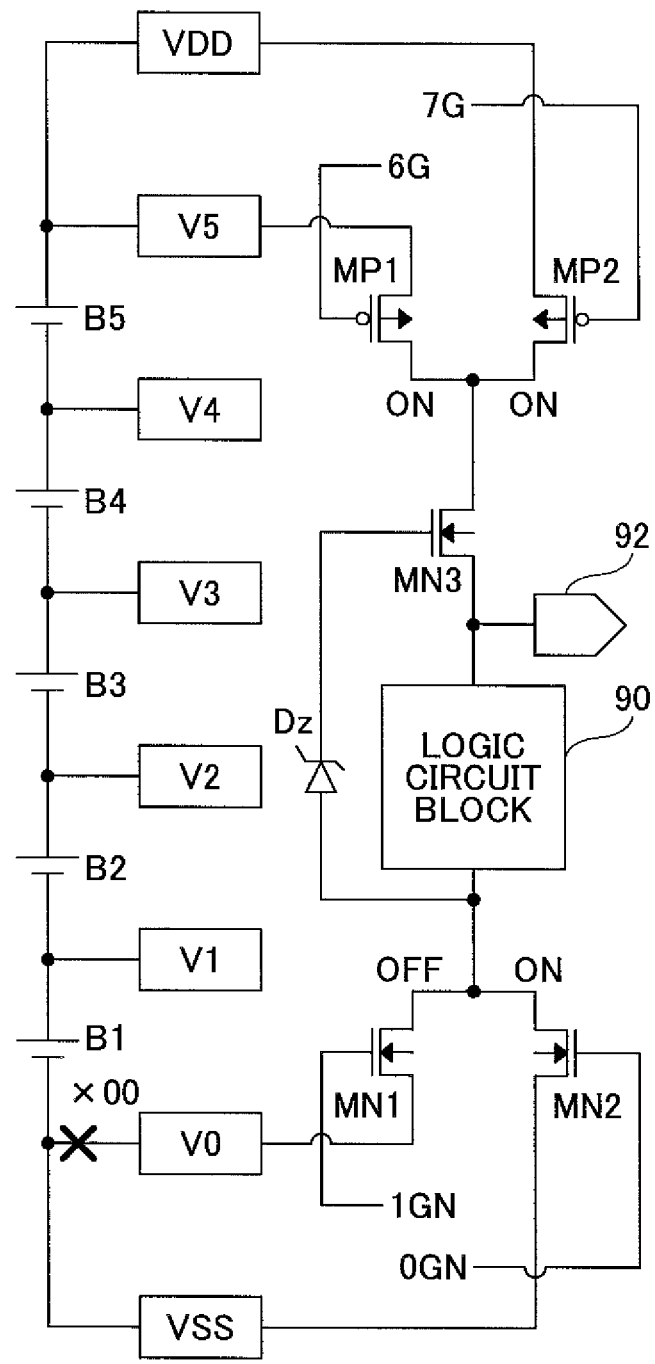

FIG. 9A illustrates a supply channel of low voltage power at a normal time when the connection lines of the power supply terminals VDD and VSS conduct electricity (with the MOS transistors MP1, MP2, MN1, and MN2 turned ON). FIG. 9B illustrates a supply channel of low voltage power at the time of detection of an open circuit in the connection line of the power supply terminal VDD (with the MOS transistors MP1, MN1, and MN2 turned ON and the MOS transistor MP2 turned OFF). FIG. 9C illustrates a supply channel of low voltage power at the time of detection of an open circuit in the connection line of the supply voltage sensing terminal V5 (with the MOS transistors MP2, MN1, and MN2 turned ON and the MOS transistor MP1 turned OFF). FIG. 9D illustrates a supply channel of low voltage power at the time of detection of an open circuit in the connection line of the power supply terminal VSS (with the MOS transistors MP1, MP2, and MN1 turned ON and the MOS transistor MN2 turned OFF). FIG. 9E illustrates a supply channel of low voltage power at the time of detection of an open circuit in the connection line of the supply voltage sensing terminal V0 (with the MOS transistors MP1, MP2, and MN2 turned ON and the MOS transistor MN1 turned OFF).

According to the above-described embodiment, the supply voltage sensing terminals V5 and V0 are provided for the power supply terminals VDD and VSS, respectively, thereby allowing an open circuit to be detected in the connecting parts xDD, xSS, x05, and x00 of the terminals VDD, VSS, V5, and V0. Further, the period of the detection of an open circuit in the connecting parts xDD, xSS, and x05 through x00 of the terminals VDD, VSS, and V5 through V0 are divided into Periods T0 through T7, and the detection is performed by turning ON analog switches necessary for each of Periods T0 through T7, thereby ensuring that an open circuit is detectable in each of the connecting parts xDD, xSS, and x05 through x00.

A series circuit of the analog switch SD5 and the resistor R03 and a series circuit of the analog switches SD1 and S51 are connected between the power supply terminal VDD and the supply voltage sensing terminal V5. A series circuit of the analog switch SS0 and the resistor R04 and a series circuit of the analog switches S00 and SS1 are connected between the power supply terminal VSS and the supply voltage sensing terminal V0. Normally, the power supply terminal VDD and the supply voltage sensing terminal V5 are connected by turning ON the analog switch SD5 or turning ON the analog switches SD1 and S51, and the power supply terminal VSS and the supply voltage sensing terminal V0 are connected by turning ON the analog switch SS0 or turning ON the analog switches S00 and SS1. If there is an open circuit in the connecting part xDD of the power supply terminal VDD or in the connecting part xSS of the power supply terminal VSS, while feeding electric current from the supply voltage terminal V5 or V0, the potential difference between the power supply terminal VDD and the supply voltage sensing terminal V5 or between the power supply terminal VSS and the supply voltage sensing terminal V0 is kept within such a voltage range as to allow no electric current to flow in a forward direction in the parasitic diode Dp or Dp' (FIG. 5 or FIG. 6), thereby preventing base current from flowing through the semiconductor substrate. This makes it possible to avoid adversely affecting other circuits.

Further, at the time of detecting an open circuit between any of the lithium-ion cells B1 through B5 and a corresponding terminal of the corresponding battery voltage monitoring circuit, the resistor R00 serving as a load is connected between terminals of adjacent ones of the lithium-ion cells B1 through B5, so that an open circuit causes an abnormal voltage to be generated. By using the same value VREF for the reference voltage for open circuit detection in that case and for the reference voltage for determination of battery voltage reduction, it is possible to perform open circuit detection and determination of battery voltage reduction at the same time.

Further, the inputs to the comparators COM1 and COM2 for open circuit detection are in a wide voltage range corresponding to the voltage across the power supply terminals VSS and VDD. Therefore, the comparator COM1, which uses a p-channel MOS transistor for a differential stage, and the comparator COM2, which uses an n-channel MOS transistor for a differential stage, are provided, and switching is performed so that the comparator COM1 is used if the value of the signal TC is 0 and the comparator COM2 is used if the value of the signal TC is 1.

Further, a low voltage necessary for the logic circuit block 90 is generated with the lithium-ion cells B1 through 35 of the battery pack serving as a supply source. The MOS transistors MP1, MP2, MN1, and MN2 are provided between a set of a low voltage source (the Zener diode Dz) and the logic circuit block 90 and a set of the power supply terminals VDD and VSS and between the set of the low voltage source (the Zener diode Dz) and the logic circuit block 90 and a set of the supply voltage sensing terminals V5 and V0, thereby making it possible to detect an open circuit without causing a problem to a supply of electric current to the low voltage source (the Zener diode Dz).

According to an aspect of the present invention, it is possible to detect an open circuit in a part that connects an electrode terminal of a battery pack and a power supply terminal of a battery voltage monitoring circuit.

The present invention is not limited to the specifically disclosed embodiment, and variations and modifications may be made without departing from the scope of the present invention.

What is claimed is:
1. A battery voltage monitoring circuit, comprising:
 a first power supply terminal to be connected to a positive terminal of a battery pack having a plurality of rechargeable cells connected in series;
 a first supply voltage sensing terminal to be connected to the positive terminal of the battery pack;

a first resistor connected between the first power supply terminal and the first supply voltage sensing terminal;

a second supply voltage sensing terminal to be connected to a negative terminal of a first rechargeable cell of the rechargeable cells, the first rechargeable cell being on a positive terminal side of the battery pack and connected to the positive terminal of the battery pack;

a second resistor connected between the second supply voltage sensing terminal and the first power supply terminal;

a voltage detecting circuit connected between the first supply voltage sensing terminal and the second supply voltage sensing terminal to operate as a protection circuit; and a first comparator configured to compare a voltage at the first power supply terminal and a voltage at the first supply voltage sensing terminal and detect an open circuit in a connection between a positive terminal of the first rechargeable cell and the first power supply terminal based on a result of said comparing.

2. The battery voltage monitoring circuit as claimed in claim 1, further comprising:

a second power supply terminal to be connected to a negative terminal of the battery pack;

a third supply voltage sensing terminal to be connected to the negative terminal of the battery pack;

a third resistor connected between the second power supply terminal and the third supply voltage sensing terminal;

a fourth supply voltage sensing terminal to be connected to a positive terminal of a second rechargeable cell of the rechargeable cells, the second rechargeable cell being on a negative terminal side of the battery pack and connected to the negative terminal of the battery pack; and a second comparator configured to compare a voltage at the second power supply terminal and a voltage at the third supply voltage sensing terminal, wherein the second resistor is connected between the fourth supply voltage sensing terminal and the second power supply terminal.

3. The battery voltage monitoring circuit as claimed claim 2, further comprising:

a switch configured to switch an electrical connection of the second resistor between a first state where the second resistor is electrically connected between the second supply voltage sensing terminal and the first power supply terminal and a second state where the second resistor is electrically connected between the fourth supply voltage sensing terminal and the second power supply terminal.

* * * * *